US011742463B2

(12) United States Patent
Schmidt et al.

(10) Patent No.: US 11,742,463 B2
(45) Date of Patent: Aug. 29, 2023

(54) WAVELENGTH CONVERTED LIGHT EMITTING DEVICE

(71) Applicant: Lumileds LLC, San Jose, CA (US)

(72) Inventors: Peter Josef Schmidt, Aachen (DE); Oleg Borisovich Shchekin, San Francisco, CA (US); Walter Mayr, Aachen (DE); Hans-Helmut Bechtel, Aachen (DE); Danielle Chamberlin, Belmont, CA (US); Regina Mueller-Mach, San Jose, CA (US); Gerd Mueller, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 80 days.

(21) Appl. No.: 17/159,528

(22) Filed: Jan. 27, 2021

(65) Prior Publication Data

US 2021/0151642 A1    May 20, 2021

Related U.S. Application Data

(63) Continuation of application No. 15/740,549, filed as application No. PCT/EP2016/064987 on Jun. 28, 2016, now Pat. No. 10,910,529.

(60) Provisional application No. 62/188,009, filed on Jul. 2, 2015.

(51) Int. Cl.
    *H01L 33/50*    (2010.01)
(52) U.S. Cl.
    CPC .......... *H01L 33/508* (2013.01); *H01L 33/502* (2013.01); *H01L 33/504* (2013.01); *H01L 33/501* (2013.01)

(58) Field of Classification Search
    CPC ... H01L 33/502; H01L 33/508; H01L 33/504; H01L 33/501
    See application file for complete search history.

(56) References Cited

U.S. PATENT DOCUMENTS

| | | |
|---|---|---|
| 7,361,938 B2 | 4/2008 | Mueller et al. |
| 7,554,258 B2 | 6/2009 | Rossner et al. |
| 7,902,564 B2 | 3/2011 | Mueller-Mach et al. |
| 9,102,875 B2 | 8/2015 | Pan et al. |
| 9,120,972 B2 | 9/2015 | Yoshida |
| 9,222,017 B2 | 12/2015 | Yoshida |
| 9,359,260 B2 | 6/2016 | Mueller et al. |
| 9,722,148 B2 | 8/2017 | Mueller et al. |
| 10,290,775 B2 | 5/2019 | Mueller et al. |

(Continued)

FOREIGN PATENT DOCUMENTS

| | | |
|---|---|---|
| CN | 102208521 A | 10/2011 |
| CN | 103347982 A | 10/2013 |

(Continued)

OTHER PUBLICATIONS

EPO as ISA, "International Search Report and Written Opinion" dated Sep. 7, 2016 from International Application No. PCT/EP2016/064987, filing date: Jun. 28, 2016, 13 pages.

*Primary Examiner* — Ermias T Woldegeorgis

(57) ABSTRACT

In a method according to embodiments of the invention, for a predetermined amount of light produced by a light emitting diode and converted by a phosphor layer comprising a host material and a dopant, and for a predetermined maximum reduction in efficiency of the phosphor at increasing excitation density, a maximum dopant concentration of the phosphor layer is selected.

18 Claims, 3 Drawing Sheets

(56) References Cited

U.S. PATENT DOCUMENTS

| | | |
|---|---|---|
| 2004/0145308 A1 | 7/2004 | Rossner et al. |
| 2005/0269582 A1 | 12/2005 | Mueller et al. |
| 2007/0080361 A1 | 4/2007 | Malm |
| 2008/0138919 A1 | 6/2008 | Mueller et al. |
| 2009/0279279 A1 | 11/2009 | Hsueh |
| 2011/0210658 A1 | 9/2011 | Pan et al. |
| 2012/0141771 A1* | 6/2012 | Pan .................. H01L 51/52 |
| | | 428/312.8 |
| 2015/0008463 A1* | 1/2015 | Yoshida ............... C09K 11/025 |
| | | 252/301.4 F |
| 2015/0322338 A1 | 11/2015 | Yoshida |
| 2016/0254418 A1 | 9/2016 | Mueller et al. |
| 2017/0309791 A1 | 10/2017 | Mueller et al. |

FOREIGN PATENT DOCUMENTS

| | | |
|---|---|---|
| JP | 2004146835 A | 5/2004 |
| JP | 2006005367 A | 1/2006 |
| JP | 2010514189 A | 4/2010 |
| JP | 2014501685 A | 1/2014 |
| JP | 2015028148 A | 2/2015 |
| KR | 20140003455 A | 6/2014 |
| KR | 20150030774 A | 3/2015 |
| WO | 2014/015038 A1 | 1/2014 |

\* cited by examiner

WAVELENGTH CONVERTED LIGHT EMITTING DEVICE

CROSS-REFERENCE TO RELATED APPLICATIONS

The present application is continuation application of U.S. patent application Ser. No. 15/740,549 filed on Dec. 28, 2017, which is a § 371 application of International Application No. PCT/EP2016/064987 filed on Jun. 28, 2016 and titled "WAVELENGTH CONVERTED LIGHT EMITTING DEVICE," which claims the benefit of U.S. Provisional Patent Application No. 62/188,009 filed on Jul. 2, 2015. Each of the above applications are incorporated herein by reference in their entirety.

FIELD OF THE INVENTION

The present invention relates to wavelength converted light emitting devices such as light emitting diodes.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

To create a white light solid state light source, the blue light from an LED or laser illuminates a yellow-green phosphor, such as a YAG:Ce phosphor, or a combination of red and green phosphors, so that the combination of the light generated by the phosphor and the blue light leaking through creates white light. Some phosphors are quenched or saturated under very bright blue light (e.g., above 100 W/cm$^2$) produced by a high power blue light source. Quenching or saturation may lead to undesirable color shifts and reduced light output.

SUMMARY

It is an object of the invention to provide a wavelength converted light emitting device with a wavelength converting material that is efficient even at high excitation density.

It is an object of the invention to avoid or minimize color shifts with increasing brightness in phosphor converted light sources, in particular where two or more phosphors are used to generate, for example, warm white light, which may require constant conversion efficiencies for all phosphors used.

A structure according to embodiments of the invention includes a light source emitting light having a first peak wavelength and a phosphor disposed in a path of light emitted by the light source. The phosphor absorbs light emitted by the light source and emits light having a second peak wavelength. The phosphor includes a host material and a dopant, a first region having a first dopant concentration, and a second region having a second dopant concentration. The second dopant concentration is less than the first dopant concentration. The phosphor is arranged such that light emitted by the light source reaches the second region before the first region.

A structure according to embodiments of the invention includes a light emitting diode emitting and phosphor particles disposed in a path of light emitted by the light emitting diode. Each phosphor particle includes a first region having a first dopant concentration and a second region having a second dopant concentration. The second dopant concentration is less than the first dopant concentration.

DETAILED DESCRIPTION

A phosphor is essentially a crystalline host material (sometimes called a lattice) doped with activators or dopants ("activators" and "dopants" are used interchangeably herein). Examples of common activator species include $Eu^{2+}$, $Eu^{3+}$, and $Ce^{3+}$. When the phosphor is exposed to light in a particular wavelength range (the excitation spectrum), the activators absorb the excitation light and emit light of a longer wavelength (the emission spectrum).

As described above, some phosphors become saturated when exposed to, for example, blue light from an LED. In particular, as the excitation density increases (i.e., the amount of light per area incident on the phosphor), the efficiency of the phosphor decreases. The reduction in efficiency with increasing excitation density may be referred to herein as "droop."

Many processes may cause or exacerbate droop. Without limiting embodiments of the invention to any particular theory, two processes that may influence droop are ground state exhaustion and excited state interaction. (Embodiments of the invention may not address ground state exhaustion.) Excited state interaction may include exited state absorption (ESA) and quantum-mechanical interaction (QMI). ESA may depend on the electronic band structure of the host, and/or the energetic position of dopant levels relative to the host band structure. QMI may depend on the crystal structure of the host; in particular, the distance between the emitting and the absorbing exited dopants. For example, a photon emitted by an excited activator may absorbed by another already excited activator, exciting an electron into the host material conduction band rather than emitting a photon, thereby reducing the efficiency of the phosphor. This effect may be more prevalent at higher temperatures.

Figure 1:
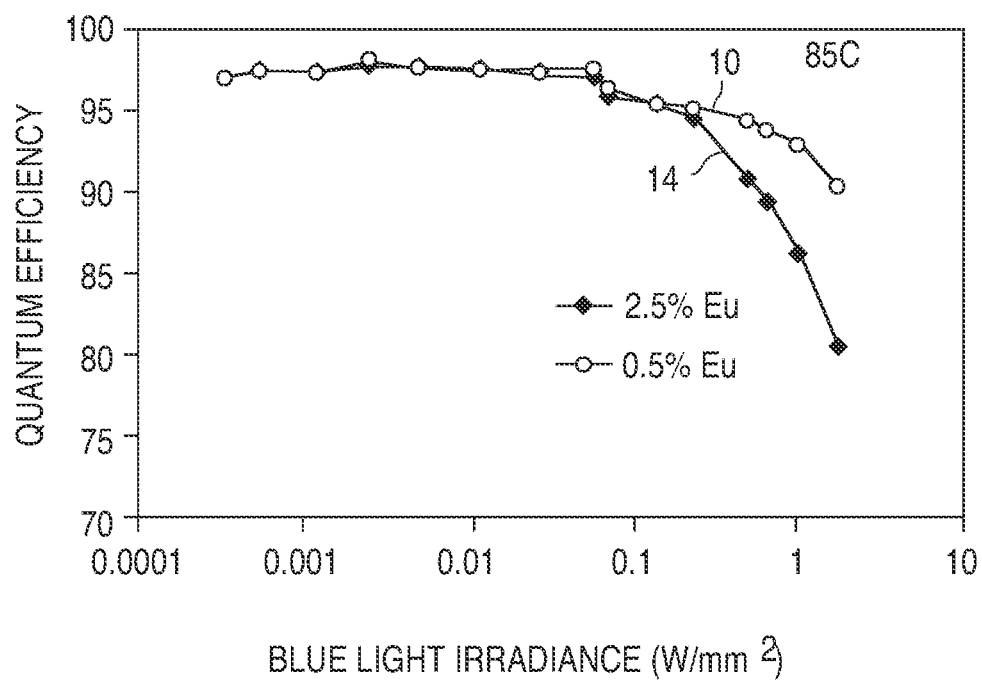
FIG. 1 is a plot of quantum efficiency as a function of irradiance, for two phosphors with the same host, $(Ba_{0.1}Sr_{0.9})_2Si_5N_8$, and different concentrations of the dopant $Eu^{2+}$.

As the activator concentration increases, the decrease in efficiency at any excitation density may become more pronounced, as illustrated in FIG. 1. FIG. 1 is a plot of measured quantum efficiency as a function of irradiance from a blue-emitting laser (in $W/mm^2$). The two phosphors illustrated in FIG. 1 have the same host material, $(Ba_{0.1}Sr_{0.9})_2Si_5N_8$, and the same activator, $Eu^{2+}$. Two different activator concentrations are illustrated, 0.5% (curve 10) and 2.4% (curve 14). As illustrated in FIG. 1, for the higher activator concentrations, the efficiency of the phosphor at the highest excitation densities is lower than the efficiency of the phosphor with the lowest activator concentration at the highest excitation densities.

In embodiments of the invention, phosphors are synthesized or applied to a device in such a way as to reduce or eliminate droop, the observed efficiency drop at increasing excitation density. The host material of the phosphors in the embodiments described below may be, for example, CaS, $(Ca,Sr)Ga_2S_4$, $Ba_{2-x}M_xSi_{5-y}Al_yN_{8-y}O_y$, wherein M represents Sr or Ca, $0 \leq x \leq 1$, and $0.0005 < y < 0.05$ (BSSNE), $Ca_{1-x}Sr_xAlSiN3$, wherein $0 \leq x \leq 1$, preferably $0 < x < 0.95$ (SCASN), eCas, YAG, or any other suitable host material. The activator in the phosphors in the embodiments described herein may be, for example, a rare earth material, Europium, $Eu^{2+}$, Cerium, $Ce^{3+}$, or any other suitable material. In the examples below, the activator is Europium. However, Cerium-doped phosphors may also experience droop, often at much higher incident power densities than Europium-doped phosphors. For example, a $Ce^{3+}$ phosphor may exhibit similar droop at about 50 $W/mm^2$ that an $Eu^{2+}$ phosphor exhibits at 1 $W/mm^2$.

Figure 2:
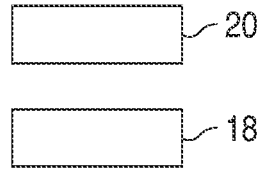
FIG. 2 is a cross section of a device including a light source and a wavelength converting structure.

FIG. 2 illustrates a device according to embodiments of the invention. A wavelength converting structure 20 is disposed in a path of light emitted from a light emitting device 18 such as a light emitting diode (LED). The wavelength converting structure 20 may be a phosphor, which includes a host and a dopant. Wavelength converting structure 20 may be in direct contact with light emitting device 18 or it may be spaced apart from the light emitting device 18. Wavelength converting structure 20 may include one or more phosphors.

In some embodiments, one or more optical elements such as lenses (not shown in FIG. 2) may be included in the device of FIG. 2. For example, an optical element may be disposed between light emitting device 18 and wavelength converting structure 20, in order to shape, filter, and/or at least partially collimate light extracted from the light emitting device 18. In addition or alternatively, an optical element may be disposed over wavelength converting structure 20, in order to shape, filter, and/or at least partially collimate light extracted from the wavelength converting structure 20. Examples of optical elements include filters, dome lenses, Fresnel lenses, compound parabolic concentrators, and any other suitable structure.

In some embodiments, for a predetermined amount of light produced by the light emitting device 18 and converted by wavelength converting structure 20, and for a predetermined maximum reduction in efficiency of the wavelength converting structure at increasing excitation density (i.e. maximum allowed droop), a maximum average dopant concentration in the wavelength converting structure 20 is selected. The predetermined maximum reduction in efficiency may result in a color shift of the resulting total emission. Some applications, in particular applications using multiple phosphors such as, for example, devices that produce warm white light, may require constant or near constant conversion efficiencies for all phosphors used. Accordingly, in some embodiments, the color shift that may be tolerated in an application may determine the predetermined maximum reduction in efficiency.

The wavelength converting structure 20 may be a phosphor layer of substantially uniform average dopant concentration, a layered structure, or a graded composition structure, such as the phosphors described in any of the examples below.

In practice, the thickness of the wavelength converting structure 20 of FIG. 2 is limited. For example, as described below, droop may be reduced by lowering the dopant concentration, but as the dopant concentration is reduced, a predetermined amount of converted light demands greater thickness, to a limit where a dopant concentration approaching zero requires an infinite thickness. Accordingly, in some embodiments, for a predetermined wavelength converting structure thickness 20, and for a predetermined maximum reduction in efficiency of the wavelength converting structure at increasing excitation density (i.e. maximum allowed droop), a maximum average dopant concentration in the wavelength converting structure 20 is selected.

The light emitting device 18 may be any suitable device that emits light that may excite one or more wavelength converting materials in wavelength converting structure 20. In some embodiments, light emitting device 18 is a III-nitride LED that emits blue or UV light. A III-nitride LED may be, for example, a flip chip device, where a majority of light is extracted through a surface of the LED opposite a surface on which electrical contacts are formed; a vertical device, where electrical contacts are formed on opposite sides of the device; or a lateral device, where both electrical contacts are formed on a surface of the device through which a majority of light is extracted. The growth substrate on which the III-nitride device layers are grown may be part of the device, may be thinned, or may be completely removed. Any suitable light emitting device may be used.

Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used, as long as the emission of the device overlaps with the excitation spectrum of the wavelength converting structure 20.

Suitable wavelength converting structures 20 may include one or more of the phosphors and/or structures described in the embodiments below. The wavelength converting structure 20 may be disposed on the LED, or spaced apart from the LED. In some embodiments, the concentration of dopant in the wavelength converting structure, and/or the arrangement of the dopant, are selected such that a predetermined light emission from the light emitting structure 18, a predetermined maximum reduction of the efficiency of the wavelength converting structure is not surpassed (i.e., a maximum droop level is not exceeded).

The wavelength converting structure includes one or more wavelength converting materials which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. The final spectrum of light extracted from the structure may be white, polychromatic, or monochromatic.

Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure. The wavelength converting structure may include light scattering or light diffusing elements e.g. $TiO_2$.

In some embodiments, wavelength converting structure 20 is a structure that is fabricated separately from the LED and attached to the LED, for example through wafer bonding or a suitable adhesive such as silicone or epoxy. One example of such a pre-fabricated wavelength converting element is a ceramic phosphor, which is formed by, for example, sintering powder phosphor or the precursor materials of phosphor into a ceramic slab, which may then be diced into individual wavelength converting elements. A ceramic phosphor may also be formed by, for example tape casting, where the ceramic is fabricated to the correct shape, with no dicing or cutting necessary. Examples of suitable non-ceramic pre-formed wavelength converting elements include powder phosphors that are dispersed in transparent material such as silicone or glass that is rolled, cast, or otherwise formed into a sheet, then singulated into individual wavelength converting elements, and phosphor mixed with silicone and disposed on a transparent substrate.

A reflecting material (not shown in FIG. 2) may be disposed on the sides of the LEDs and the wavelength converting element, in order to force light to exit the device through the top surface.

Figure 3:
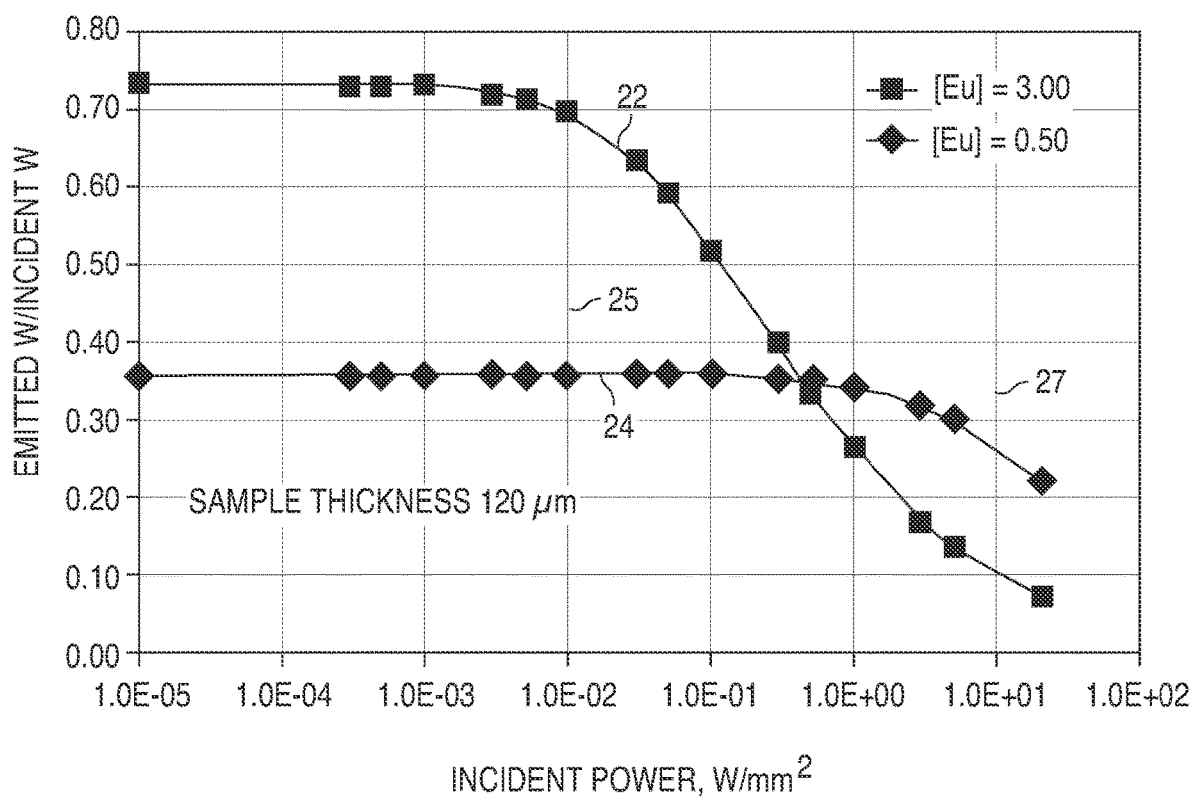
FIG. 3 is a plot of power emitted/incident power as a function of excitation density for two materials, one that exhibits droop (i.e. a reduction in efficiency of the phosphor at increasing excitation density) at a given excitation density, and one that does not exhibit droop at the given excitation density, such as, for example, 0.2 W/mm$^2$.

In some phosphors, droop may be reduced or eliminated by reducing the activator concentration. In some embodiments, wavelength converting structure 20 includes a phosphor including a host material and an activator that at certain activator concentrations does suffer from droop. The phosphor is doped to an activator concentration that does not exhibit a decrease in efficiency at increasing excitation intensity. The efficiency curve of such a phosphor is illustrated in FIG. 3 (the phosphor illustrated in FIG. 3 may be the same phosphor illustrated in FIG. 1). FIG. 3 is a plot, for two phosphors with the same host and different dopant concentrations, of emitted power/incident power for a given phosphor thickness, as a function of incident power (excitation density). Curve 22 represents a phosphor with a higher activator concentration than the phosphor of curve 24.

As illustrated in FIG. 3, the phosphor with the higher activator concentration exhibits droop (curve 22) at the incident power indicated at 25, while the phosphor with the lower activator concentration (curve 24) does not exhibit droop at the incident power indicated at 25. In some embodiments, the phosphor includes a host material that at certain activator concentrations does suffer from droop at a selected excitation density (i.e., curve 22 at incident power 25). The activator concentration may be reduced such that the phosphor does not suffer from droop at a given excitation density (i.e., curve 24 at incident power 25). At excitation densities other than the selected excitation density, the phosphor may exhibit droop (i.e., curve 24 at incident power 27).

The activator in the phosphors represented by curves 22 and 24 may be, for example, a rare earth material, Europium, or $Eu^{2+}$ in some embodiments.

Because a phosphor with a lower activator concentration has fewer activators, for the same quantity of phosphor, the phosphor illustrated by curve 24 may emit less light at a given incident power density than the phosphor illustrated by curve 22. Accordingly, to reach a given brightness, more phosphor may be used in a device where the wavelength converting structure 20 includes phosphor represented by curve 24.

In some embodiments, the phosphor illustrated by curve 24 is included in wavelength converting structure 20. (The phosphor illustrated by curve 22 is not included in the device, rather it is described above as a reference against which the performance of the phosphors illustrated by curve 24 is compared.) The phosphor illustrated by curve 24 may be, in some embodiments, the only phosphor with that host material included in wavelength converting structure 20. The phosphor illustrated by curve 24 may be disposed in a single layer of substantially uniform dopant concentration. The activator concentration in the phosphor illustrated by curve 24 is substantially uniform throughout wavelength converting structure 20, i.e. the activator concentration is not graded in a horizontal or vertical plane in wavelength converting structure 20.

In some embodiments, wavelength converting structure 20 includes a powder phosphor that is produced to increase the distance between activators within each phosphor particle, which may reduce or eliminate droop.

Figure 4:
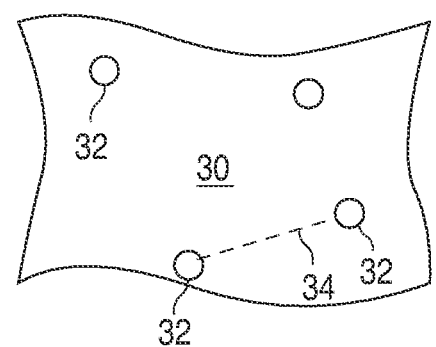
FIG. 4 illustrates a portion of a surface of a phosphor particle.

A phosphor portion 30 may be characterized by a spacing 34 between activators 32, as illustrated in FIG. 4. In some embodiments, the spacing 34 may be increased, as compared to a given commercially used phosphor with the same host material and the same activator concentration. In some embodiments, the activator 32 is a rare earth material, Europium, or $Eu^{2+}$. The average spacing 34 may be at least 15 Å in some embodiments, at least 18 Å in some embodiments, at least 20 Å in some embodiments, at least 25 Å in some embodiments, and no more than 50 Å in some embodiments.

In some embodiments, the wavelength converting structure 20 includes a phosphor with a graded concentration of activators. The activator concentration may be graded in a direction perpendicular to a major surface of the wavelength converting structure 20. The activator concentration may be lowest in a region closest to the excitation light source, and highest in a region furthest from the excitation light source.

In a homogeneously doped phosphor such as a ceramic phosphor, the excitation power decreases exponentially with depth into the phosphor. In effect, as light is absorbed by the phosphor, the excitation density is reduced. As the excitation density decreases with depth into the phosphor, the droop exhibited by the phosphor may also decrease.

In a wavelength converting structure 20 with a graded phosphor, droop may be reduced or eliminated, as compared to the same phosphor when homogeneously doped. As used herein, "grading" the activator concentration may refer to any change in concentration other than a single, stepwise change in concentration. The graded activator concentration profile may take any shape including, for example, a linear, step-graded, or a power law profile, and may include multiple or no regions of constant activator concentration.

Figure 5:
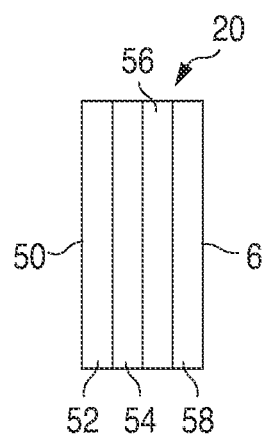
FIG. 5 is a cross section of a step graded wavelength converting structure.

FIG. 5 illustrates one example of a slab-type graded wavelength converting structure 20. The wavelength converting structure 20 includes multiple layers 52, 54, 56, and 58 of different activator concentration. Within each of layers 52, 54, 56, and 58, the activator concentration may be constant and uniform, though this is not required. The wavelength converting structure 20 of FIG. 5 may be a ceramic, or any other suitable structure. Though four layers are illustrated in FIG. 5, more or fewer layers may be used. In some embodiments, two to ten layers are included.

The total thickness of the wavelength converting structure 20 of FIG. 5 may be at least 100 μm thick in some embodiments, no more than 400 μm thick in some embodiments, at least 200 μm thick in some embodiments, and no more than 300 μm thick in some embodiments. Each layer may be the same thickness, though this is not required. Each layer may have a thickness of at least 10 μm in some embodiments and no more than 100 μm in some embodiments.

Figure 6:
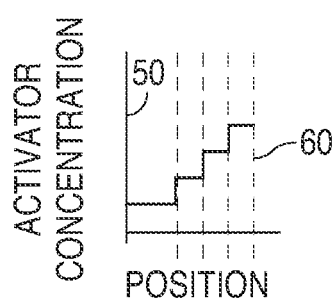
FIG. 6 is a plot of activator concentration as a function of position for one example of the structure of FIG. 8.

The surface 50 of wavelength converting structure 20 faces the light source 18. Accordingly, layer 52 may have the lowest activator concentration. The surface 60 of wavelength converting structure 20 is furthest from the light source. Accordingly, layer 58 may have the highest activator concentration. FIG. 6 illustrates the activator concentration as a function of position from surface 50 to surface 60 for one example of a wavelength converting structure 20. Four layers of constant and different activator concentration are illustrated. The concentration increases from surface 50 to surface 60 in multiple steps.

Figure 7:
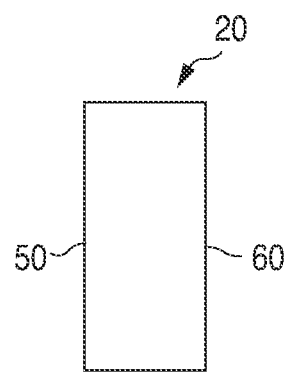
FIG. 7 is a cross section of a continuously graded wavelength converting structure.
Figure 8:
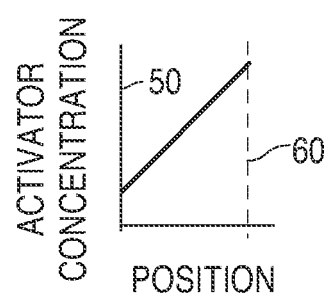
FIGS. 8 and 9 are plots of activator concentration as a function of position for two examples of the structure of FIG. 7.
Figure 9:
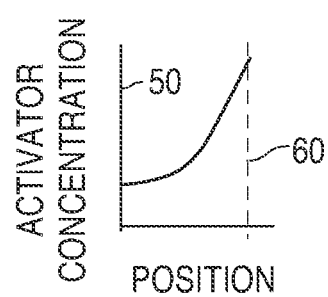

FIG. 7 illustrates another example of a slab-type wavelength converting structure 20. The wavelength converting structure of FIG. 7 is continuously graded, rather than stepwise graded, as illustrated in FIG. 5. In FIG. 7, like FIG. 5, surface 50 is closest to the light source and surface 60 is furthest from the light source. FIGS. 8 and 9 illustrate two possible grading profiles for the structure of FIG. 7, in plots of activator concentration as a function of position. In each grading profile, the activator concentration increases from a lowest concentration at surface 50 to a highest concentration at surface 60. FIG. 8 illustrates a linear grading profile. FIG. 9 illustrates a quadratic grading profile. Other profiles such as exponential, polynomial, or any other suitable profile can be used to grade the wavelength converting structure 20.

In some embodiments, the individual particles in a powder phosphor have a dopant concentration that varies across the particle. An individual particle may have a first region with a first average dopant concentration and a second region with a second average dopant concentration, where the first and second average dopant concentrations are different. The first and second regions may be arranged to reduce or eliminate droop.

The same effect described in the graded phosphors of FIGS. 5 and 7, where a more highly doped portion of the phosphor is "screened" by a lower doped portion of the phosphor, reducing the excitation density in the more highly doped portion, may be achieved in a powder phosphor by forming the phosphor particles with a dopant concentration that varies across the particle, such that the center portion of each particle is more highly doped than the outer portion of each particle.

Figure 11:
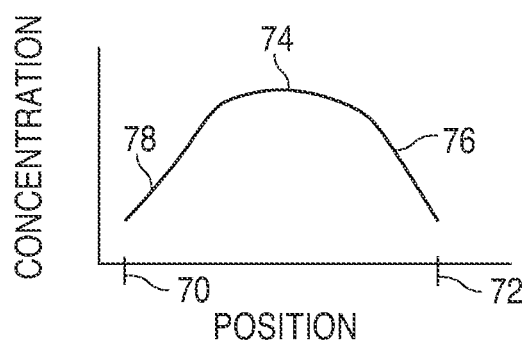
FIG. 11 is a plot of concentration as a function of position for a phosphor particle.

FIG. 11 is a plot of dopant concentration as a function of diameter for one example of such a phosphor particle. In the plot, 70 and 72 represent the outer edges of the particle, and 74 represents the center. The dopant concentration is lower at the edges of the particle than at the center, where it may be highest. The lower doped outer portion of each particle is the first part of the particle that "sees" light from the light emitting diode. The lower doped outer portion of each particle therefore reduces the excitation density at the more highly doped center, which may reduce the droop and may increase the efficiency of the phosphor. The concentration gradient in the phosphor particle is not limited to the particular profile illustrated in FIG. 11. Phosphor particles with the center more highly doped than the outer portion may formed by providing or synthesizing a doped core, growing a non-doped shell around the doped core, and diffusing the dopant in a thermal process partially into the outer region.

In the wavelength converting structures illustrated in FIGS. 5 and 7, and in the particles illustrated in FIG. 11, the activator may be, for example, a rare earth material, Cerium, $Ce^{3+}$, Europium, or $Eu^{2+}$.

Figure 10:
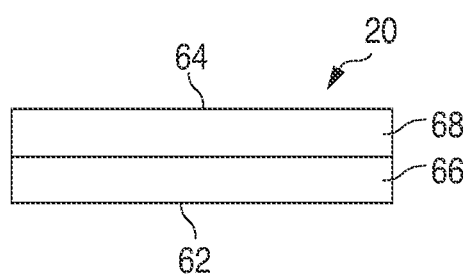
FIG. 10 is a cross section of a wavelength converting structure including multiple phosphors.

FIG. 10 illustrates a wavelength converting structure 20 with a structure that screens a phosphor that exhibits droop, in order to reduce the excitation density of that phosphor.

Surface 62 is closest to the light source and surface 64 is furthest from the light source. The screening structure 66 is disposed closest to the light source. A phosphor 68 which exhibits a drop in efficiency at increasing excitation density is disposed furthest from the light source. The screening structure 66 absorbs light from the light source, effectively reducing the excitation density incident on phosphor 68. The characteristics of the screening structure 66, such as the material, thickness, and absorption coefficient, may be selected to reduce the excitation density incident on the phosphor 68 to a point where a predetermined maximum reduction of the phosphor's efficiency is not surpassed. Examples of suitable screening structures 66 include non-wavelength converting materials, wavelength converting materials, phosphors, layers designed to scatter light, filters, reflectors, and any other suitable structure.

In some embodiments, structure 66 is a second phosphor, which does not exhibit a drop in efficiency at increasing excitation density, or which exhibits less droop than phosphor 68. In some embodiments, structure 66 is a garnet phosphor, a YAG:Ce phosphor, or any other suitable phosphor.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A structure comprising:
   a light emitting diode (LED) configured to emit light having a first peak wavelength; and
   a phosphor configured to absorb light emitted by the LED and emit light having a second peak wavelength, the phosphor comprising:
   a host material and a dopant;
   a first phosphor region comprising a first external phosphor surface facing the LED, the first phosphor region having a first non-zero dopant concentration of the dopant, the first external phosphor surface not disposed in direct contact to any phosphor comprising a same material as the host material and disposed outside the first phosphor region;

a second phosphor region comprising a second external phosphor surface oppositely positioned from the first external phosphor surface, the second phosphor region having a second non-zero dopant concentration of the dopant greater than the first non-zero dopant concentration and arranged further from the LED than the first phosphor region, the second external phosphor surface not disposed in direct contact to any phosphor comprising a same material as the host material and disposed outside the second phosphor region.

2. The structure of claim 1 wherein the first and second regions comprise first and second layers.

3. The structure of claim 2 wherein the dopant concentration is graded between the second and first layers.

4. The structure of claim 1, wherein the phosphor includes multiple layers of different dopant concentration.

5. The structure of claim 4, wherein the dopant concentration within each of the layers is constant and uniform.

6. The structure of claim 1 wherein the dopant is any of Europium, Eu2+, Cerium, Ce3+.

7. The structure of claim 1 wherein LED is configured to emit blue light and the phosphor is configured to emit yellow or green light.

8. The structure of claim 1 wherein the phosphor is a ceramic phosphor.

9. A structure comprising:

a light emitting diode (LED), and phosphor particles having an average diameter disposed in a path of light emitted by the LED, each phosphor particle comprising a dopant and:

a core having a concentration gradient of the dopant with a first non-zero dopant concentration range, the concentration gradient continuously decreasing from a center of the core, and a shell surrounding the core having a second non-zero dopant concentration of the dopant less than the first non-zero dopant concentration range.

10. The structure of claim 9 wherein the phosphor particles are formed by providing a doped core, growing a non-doped shell around the doped core, and diffusing the dopant in a thermal process partially into the outer region.

11. The structure of claim 9 wherein the average diameter is no greater than 20 µm.

12. The structure of claim 9 wherein the average diameter is at least 2 µm.

13. The structure of claim 9 wherein the average diameter is no greater than 50 µm.

14. The structure of claim 9 wherein the dopant concentration is graded along a portion of the average diameter of each phosphor particle.

15. The structure of claim 9 wherein the dopant is any of Europium, Eu2+, Cerium, Ce3+.

16. The structure of claim 9 wherein the phosphor particles are spherical.

17. The structure of claim 9 wherein LED is configured to emit blue light and the phosphor particles are configured to emit yellow or green light.

18. The structure of claim 9 wherein the phosphor particles are ceramic phosphor particles.

* * * * *